United States Patent [19]

Ishigaki et al.

[11] Patent Number: 4,539,527
[45] Date of Patent: Sep. 3, 1985

[54] NOISE REDUCTION BY LINEAR INTERPOLATION USING A DUAL FUNCTION AMPLIFIER CIRCUIT

[75] Inventors: Yukinobu Ishigaki, Tokyo; Kazutoshi Hirohashi, Yokohama, both of Japan

[73] Assignee: Victor Company of Japan, Ltd., Japan

[21] Appl. No.: 635,352

[22] Filed: Jul. 27, 1984

[30] Foreign Application Priority Data

Jul. 30, 1983 [JP] Japan .............................. 58-140241
Aug. 17, 1983 [JP] Japan .............................. 58-150045

[51] Int. Cl.³ ........................... H03F 1/26; H04B 1/10
[52] U.S. Cl. .................................... 330/149; 328/165
[58] Field of Search .............. 330/149, 151; 328/162, 328/163, 165; 455/222, 223, 256, 303

[56] References Cited

U.S. PATENT DOCUMENTS 4,311,963 1/1982 Watanabe et al. ................. 328/163

Primary Examiner—James B. Mullins
Assistant Examiner—G. Wan
Attorney, Agent, or Firm—Lowe, King, Price & Becker

[57] ABSTRACT

In a noise reduction circuit, a sampling pulse is generated for operating a switch in time-coincident relationship with the portion of a signal which is affected by a noise impulse. The signal, applied to an input terminal, is normally passed through the switch to a junction between a capacitor and a noninverting amplifier and is blocked when the switch opens in response to the sampling pulse. A differentiator is connected in a feedback circuit from the output of the noninverting amplifier to the input thereof. The differentiator is disabled when the switch remains closed and when the switch opens in response to the sampling pulse it begins differentiating a voltage which occurred immediately prior to the detection of the noise and supplies it to the capacitor to linearly interpolate the portion of the information signal which is disrupted by the noise impulse.

6 Claims, 6 Drawing Figures

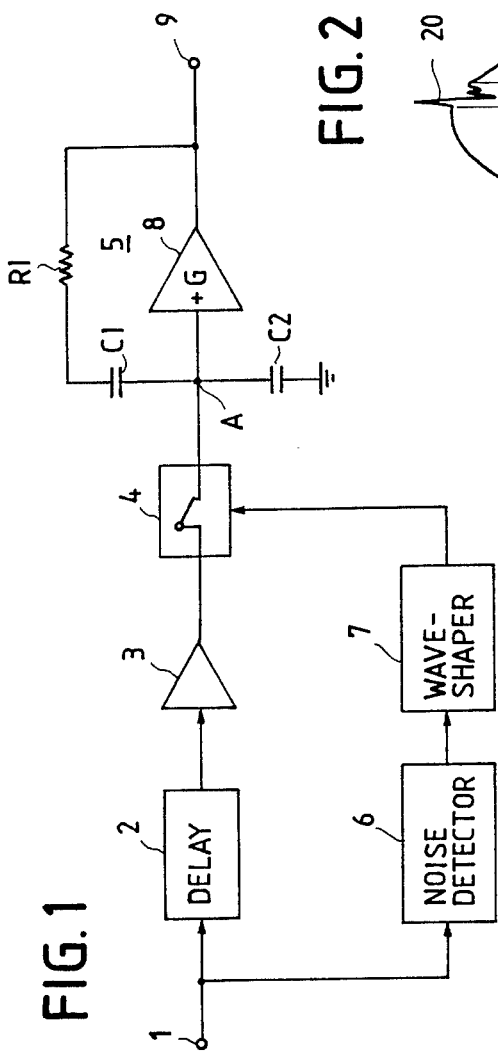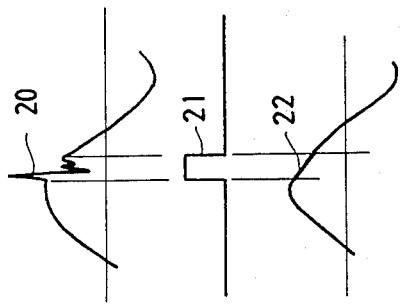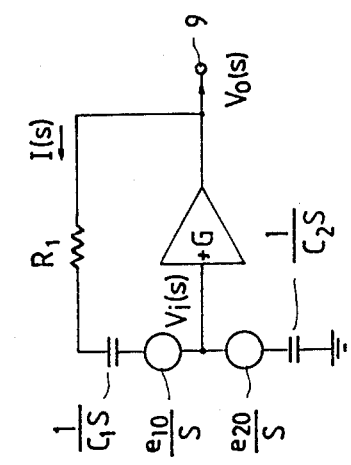

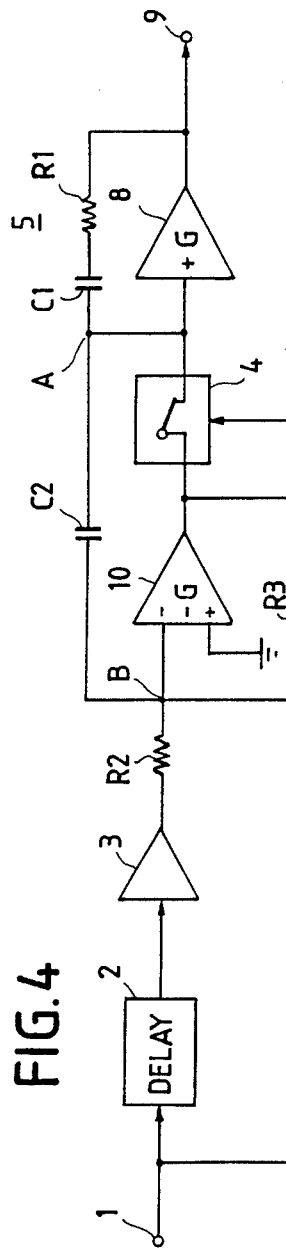
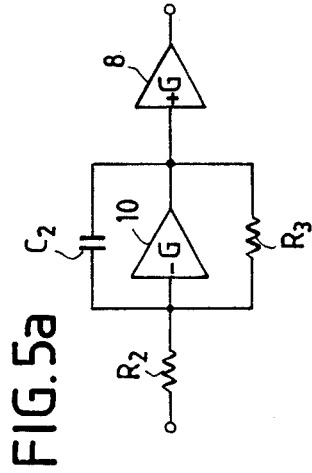
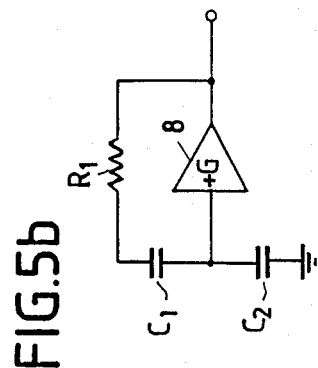
FIG.4
FIG.5a
FIG.5b

NOISE REDUCTION BY LINEAR INTERPOLATION USING A DUAL FUNCTION AMPLIFIER CIRCUIT

CROSS-REFERENCES TO COPENDING APPLICATIONS

The present invention is related to the following copending U.S. patent applications:

(1) Ser. No. 516,242, filed July 21, 1983, by Ishigaki et al, titled "Circuit for Reconstructing Noise-Affected Signals";

(2) Ser. No. 517,985, filed July 29, 1983, by Y. Ishigaki, titled "Circuit Arrangement for Reconstructing Noise-Affected Signals";

(3) Ser. No. 585,925, filed Mar. 2, 1983, by Y. Ishigaki et al, titled "Impulse noise reduction by linear inerpolation having a deemphasis characteristic"; and (4) Ser. No. 585,926, filed Mar. 2, 1984, by Y. Ishigaki et al, titled "Noise reduction by linear interpolation having immunity to white noise".

All of the copending applications are assigned to the same assignee as the present invention.

BACKGROUND OF THE INVENTION

The present invention relates to a noise reduction circuit of the type wherein the noise-affected portion of an information signal is linearly interpolated.

Linear interpolation techniques are known in the art as a means for reconstructing the portion of audio signals which is disrupted by a noise impulse. As shown and described in the above listed copending U.S. applications, the linear interpolation approach involves the use of two sample-and-hold circuits. The first sample-and-hold circuit is connected in a circuit between input and output terminals for generating a voltage which follows the waveform of the input signal during tracking modes and samples a voltage that occurs immediately prior to the detection of a noise impulse. During a sampling mode in which the information signal is affected by a noise impulse, the second sample-and-hold circuit generates a voltage that represents the rate with which previous gradient is expected to continue during this period and compensates for the voltage stored on the first sample-and-hold circuit.

SUMMARY OF THE INVENTION

An object of the present invention is to simplify the configuration of a noise reduction circuit by eliminating the second sample-and-hold circuit.

The noise reduction circuit of the present invention comprises a noise detector connected to an input terminal for detecting a noise impulse introduced in an information signal and generating a sampling pulse time-coincident with the portion of the signal affected by a noise impulse. A switch is provided for passing the information signal therethrough a node between a capacitor and a noninverting amplifier in the absence of the sampling signal and blocking the signal in response to the sampling pulse. A differentiator is connected in a feedback circuit from the output of the noninverting amplifier to the node. The capacitor stores a voltage from the switch during the absence of noise and a voltage from the differentiator when the switch opens in response to the noise. The differentiator is disabled when the switch remains closed and, when it opens, begins differentiating a voltage which occurred immediately prior to the detection of the noise and supplies it to the capacitor to linearly interpolate the portion of the information signal which is disrupted by the noise.

BRIEF DESCRIPTION OF THE DRAWINGS

The present invention will be described in further detail with reference to the accompanying drawings, in which:

FIG. 1 is a block diagram of a first embodiment of the present invention;

FIG. 2 is an illustation of waveforms generated in the circuit of FIG. 1;

FIG. 3 is an illustration of an equivalent circuit;

FIG. 4 is a block diagram of a second embodiment of the present invention; and

FIGS. 5a and 5b are illustrations of equivalent circuits of the FIG. 4 circuit.

DETAILED DESCRIPTION

Referring now to FIG. 1, there is shown a first embodiment of the present invention. The noise reduction circuit shown therein comprises a series combination of a noise detector 6 and a waveshaper 7. The noise detector produces a pulse output in response to the detection of a noise impulse introduced to an audio signal applied to an input terminal 1. The pulse output is shaped into a sharply defined rectangular pulse and applied as a sampling pulse to a normally closed electronic switch 4 which forms part of a sample-and-hold circuit. The audio input signal is delayed by a delay circuit 2 so that the portion of the audio signal which is affected by the noise impulse is rendered time coincident with the sampling pulse.

The delayed audio signal is passed through an amplifier 3 and switch 4 to a dual function amplifier circuit 5. This amplifier circuit comprises a noninverting amplifier 8 and a feedback differentiator formed by a resistor R1 and a capacitor C1 which are series connected from the output of amplifier 8 to the input thereof to which the output of amplifier 3 is also applied through switch 4.

Amplifier 3 and switch 4 form a sample-and-hold circuit with a second capacitor C2 which is grounded at one end and connected at the other end to the first capacitor C1 forming a node A therebetween.

Dual function amplifier circuit 5 operates as a linear amplifier when switch 4 remains closed and as a slope detector when this switch is open to generate a linearly varying voltage for interpolating the noise-affected portion of the input signal. This noninverting amplifier has an input impedance much higher than the output impedance of amplifier 3.

In the absence of a noise impulse, switch 4 remains in a closed circuit condition, coupling the input signal to the node A. Since the output impedance of amplifier 3 is much lower than the input impedance of amplifier 8, the feedback differentiator ceases to function or disabled during the closed circuit condition with the result that capacitor C2 is charged to the voltage of the input signal. The voltage on capacitor C2 is amplified and delivered to an output terminal 9. Therefore, the potential at terminal 9 follows the voltage on capacitor C2 as long as the audio signal is not affected by noise impulses.

In response to the detection of a noise impulse, shown at 20 in FIG. 2, a sampling pulse 21 is generated and switch 4 changes over to an open circuit condition. The voltage, which appeared at the moment immediately prior to the detection of the noise, is sampled and stored in capacitor C2 and amplified with gain G to appear at the output terminal 9. The feedback circuit is now enabled to begin differentiating the output of amplifier 8. The differentiated voltage is divided at the node A by capacitors C1 and C2. As will be understood by a mathematical analysis given below, voltage on capacitor C2 varies linearly with a positive or negative gradient, slope ratio, depending on the voltage sampled at the instant just prior to the detection of the noise provided that the capacitance ratio C2/C1 substantially equals the gain G of noninverting amplifier 8. The noise-affected portion of the audio signal is interpolated with a linearly varying voltage as shown at 22 in FIG. 2. If impulse noise occurs on a positive or uphill slope of the information signal, the interpolating voltage increases linearly, and if it occurs on a negative or downhill slope the voltage will decrease linearly.

A mathematical analysis of the noise reduction circuit of FIG. 1 is given with reference to an equivalent circuit shown in FIG. 3. The voltage output Vo(s) which appears at terminal 9 at the instant the open circuit condition occurs is given in Laplace transform notation by Equation 1:

$$V_o(s) = \left(R_1 + \frac{1}{C_1 S} + \frac{1}{C_2 S}\right) I(s) + \frac{e_{10}}{S} + \frac{e_{20}}{S} \quad (1)$$

where $R_1$ is the value of resistor R1 and $e_{10}$ and $e_{20}$ represent voltages developed respectively on capacitors C1 and C2 immediately prior to the detection of a noise impulse and I(s) is the current passing through resistor R1 which is given as follows:

$$I(s) = \frac{C_1 C_2 \{V_o(s)S - e_{10} - e_{20}\}}{C_1 + C_2 + C_1 \cdot C_2 \cdot R_1 \cdot S} \quad (2)$$

The voltage input Vi(s) to terminal 1 is given by:

$$V_i(s) = \frac{C_1 \cdot V_o(s)S - C_1 \cdot e_{10} - C_2 - C_1 \cdot C_2 \cdot R_1 \cdot S \cdot e_{20}}{S(C_1 + C_2 + C_1 \cdot C_2 \cdot R_1 \cdot S)} \quad (3)$$

Since Vo(s)=GVi(s), Vo(s) is given by:

$$V_o(s) = G \frac{(C_1 \cdot C_2 \cdot R_1 \cdot S + C_2)e_{20} - C_1 \cdot e_{10}}{S\{(1 - G)C_1 + C_2 + C_1 \cdot C_2 \cdot R_1 \cdot S\}} \quad (4)$$

If $C_2 = (G-1)C_1$ and $C_1 \cdot R_1 = T_1$, Vo(s) is given by:

$$V_o(s) = G\left\{\frac{e_{20}}{S} + \frac{(G-1)e_{20} - e_{10}}{(G-1)T_1 \cdot S^2}\right\} \quad (5)$$

Voltages $e_{10}$ and $e_{20}$ are therefore given by:

$$e_{10} = (G-1)\{V(t_1) - T_1 \cdot V'(t_1)\} \quad (6a)$$

$$e_{20} = V(t_1) \quad (6b)$$

By substituting Equations 6a and 6b for $e_{10}$ and $e_{20}$ in Equation 5, the following relation is obtained:

$$V_o(s) = G\left(\frac{V(t_1)}{S} + \frac{V'(t_1)}{S}\right) \quad (7)$$

Inverse Laplace transformation of Equation 7 results in the following Equation:

$$V_o(t) = G\{V(t_1) + V'(t_1)(t - t_1)\} \quad (8)$$

Equation 8 represents a Tailor's series excluding the differential terms of second or higher orders. It is seen from Equation 8 that the compensating voltage varies linearly at a rate $V'(t_1)$ which is the first order differentiation of the voltage at time $t_1$ and with which previous gradient is expected to continue.

A second embodiment of the present invention illustrated in FIG. 4 is advantageous for audio signals whose higher frequency components are preemphasized. The second embodiment differs from the previous embodiment in that it additionally includes a deemphasis circuit. This deemphasis circuit comprises an inverting amplifier 10 having a grounded noninverting input terminal and an inverting input terminal which is coupled by a resistor R2 to the output of amplifier 3, and a parallel combination of a resistor R3 and a normally open switch 11 connected across the inverting input and output terminals of amplifier 10. Amplifier 10 has a low impedance at the output terminal thereof which is connected through normally closed switch 4 to amplifier 8. In this embodiment, the terminal of capacitor C2 which is connected to ground in the previous embodiment is connected to a node B between resistor R2 and the inverting input of amplifier 10. Switch 11 is respsonsive to the sampling pulse to provide a short-circuit path from node B to ground.

During the closed circuit condition of switch 4, switch 11 is open and node A is at near ground potential due to the low output impedance of amplifier 10. The feedback circuit of R1 and C1 is therefore disabled as in the first embodiment. The circuit of FIG. 4 can be represented by an equivalent circuit shown in FIG. 5a in the absence of impulse noise and the transfer function G(s) of this equivalent circuit is given by:

$$G(s) = -\frac{G \cdot R_3}{R_2} \times \frac{1}{1 + T \cdot S} \quad (9)$$

where T is a time constant $C_2 \times R_3$. This time constant value is selected so that the noise reduction circuit exhibits a deemphasis characteristic on the higher frequency components of a preemphasized audio signal applied to input terminal 1.

In the presence of a noise impulse, switch 4 is open and switch 11 is closed. The node B is thus short-circuited to ground through switch 11 and the output terminal of amplifier 10 to the grounded noninverting input terminal thereof, disabling the deemphasis circuit. The noise reduction circuit is switched to a condition which is represented by an equivalent circuit shown in FIG. 5b which is identical to the previous embodiment.

What is claimed is:

1. A noise reduction circuit having an input terminal to which an information signal is applied and an output terminal, comprising:
means connected to said input terminal for detecting a noise impulse introduced in said information signal and generating therefrom a sampling pulse time-coincident with the portion of the signal affected by said noise impulse;

a switch connected in a circuit path between said input and output terminals for passing said information signal therethrough in the absence of said sampling pulse and blocking said signal in response to said sampling pulse;

a noninverting amplifier connected in said circuit path between said switch and said output terminal for amplifying said signal;

a differentiator including a resistor and a first capacitor connected from the output of said noninverting amplifier to the input thereof; and a second capacitor connected to said first capacitor forming a node at the input of said noninverting amplifier for storing a voltage from said switch and a voltage from said differentiator when said signal is blocked.

2. A noise reduction circuit as claimed in claim 1, wherein said second capacitor is connected from said node to ground.

3. A noise reduction circuit as claimed in claim 2, further comprising a second amplifier connected in said circuit path between said input terminal and said switch, and wherein the output impedance of said second amplifier is smaller than the input impedance of said noninverting amplifier.

4. A noise reduction circuit as claimed in claim 2, wherein the ratio of the capacitance value of said second capacitor to the capacitance value of said first capacitor is substantially equal to the amplification gain of said noninverting amplifier.

5. A noise reduction circuit as claimed in claim 1, further comprising a deemphasis circuit which comprises:

an inverting amplifier connected in said circuit path to be responsive to said information signal through a second resistor, the output of said inverting amplifier being connected through said switch to said node;

a third resistor coupled from the input of said inverting amplifier to the output thereof; and a second switch for providing a low impedance path between the input of said inverting amplifier to the output thereof in response to said sampling pulse, said second capacitor being connected from said node to a second node between said second resistor and the input of said inverting amplifier to define a time constant with said third resistor in the absence of said sampling pulse to provide a deemphasis characteristic.

6. A noise reduction circuit as claimed in claim 2, further comprising a second amplifier connected in said circuit path between said input terminal and said switch, and wherein the input impedance of said noninverting amplifier is higher than the output impedance of said second amplifier and a deemphasis circuit which comprises:

a third, inverting amplifier connected to the output of said second amplifier through a second resistor, the output of said inverting amplifier being connected through said switch to said node, the output impedance of said inverting amplifier being lower than the input impedance of said noninverting amplifier; and a parallel combination of a third resistor and a second switch coupled from the input of said inverting amplifier to the output thereof, said second switch providing a low impedance path between the input and output of said inverting amplifier in response to said sampling pulse, said second capacitor being connected from said node to a second node between said second resistor and the input of said inverting amplifier to define a time constant with said third resistor to provide a deemphasis characteristic in the absence of said sampling pulse.

* * * * *